United States Patent [19]

Miyajima

[11] 4,429,246
[45] Jan. 31, 1984

[54] GROUP-ARRANGED TYPE SURFACE ACOUSTIC WAVE TRANSDUCER

[75] Inventor: Hajime Miyajima, Sakado, Japan

[73] Assignee: Toko, Inc., Tokyo, Japan

[21] Appl. No.: 330,839

[22] Filed: Dec. 15, 1981

[30] Foreign Application Priority Data

Dec. 18, 1980 [JP] Japan ................................. 55-179173

[51] Int. Cl.³ ........................ H03H 9/02; H01L 41/00
[52] U.S. Cl. ............................ 310/313 B; 310/313 R; 333/151; 333/195
[58] Field of Search ....................... 310/313 A–313 D; 333/151, 154, 193–195

[56] References Cited

U.S. PATENT DOCUMENTS 3,727,155  4/1973  Devries .................................. 333/72
3,866,154 12/1975  Moore ................................... 333/154

FOREIGN PATENT DOCUMENTS 55-123222  9/1980  Japan .............................. 310/313 B Primary Examiner—J. D. Miller
Assistant Examiner—D. L. Rebsch
Attorney, Agent, or Firm—Schwartz, Jeffery, Schwaab, Mack, Blumenthal & Koch

[57] ABSTRACT

A group-arranged type unidirectional surface acoustic wave transducer, which includes, in combination, groups of interdigital electrodes wherein the center-to-center distance between the electrodes is made equal to an integral number of wavelengths plus a quarter wavelength and further groups of interdigital electrodes wherein the center-to-center distance between the electrodes is made equal to an integral number of wavelengths plus three quarter wavelengths. According to the present invention, there is also provided a unidirectional surface acoustic wave device which can be employed as a filter by changing the frequency-amplitude characteristic of the surface acoustic wave.

3 Claims, 8 Drawing Figures

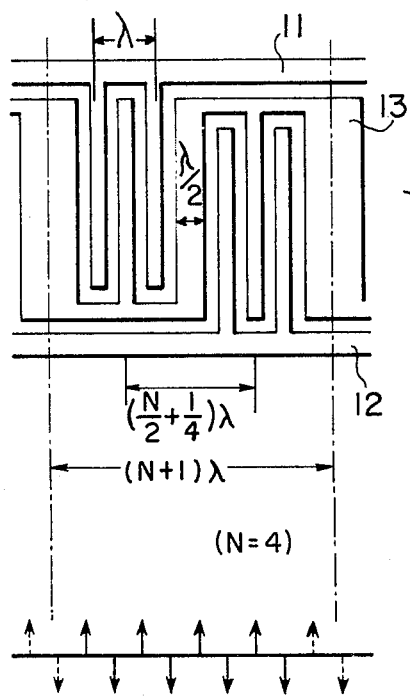
FIG. 1A
FIG. 1B
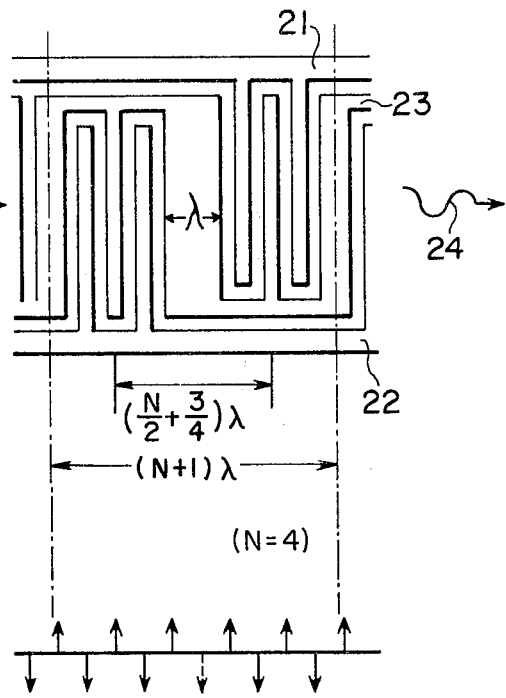
FIG. 2A
FIG. 2B
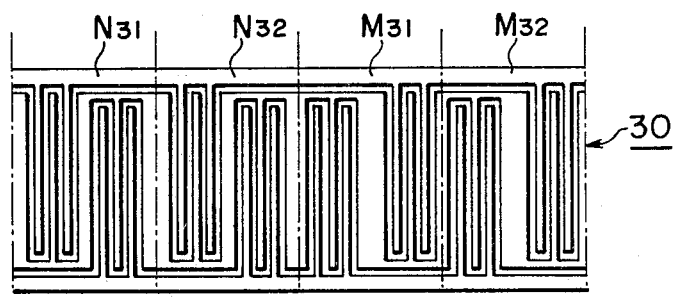
FIG. 3

M41  M42  M43  M44  N41  N42  N43

M51  52  M52  N51  N52  N53

M61  M62  N61  N62  N63

GROUP-ARRANGED TYPE SURFACE ACOUSTIC WAVE TRANSDUCER

BACKGROUND OF THE INVENTION

The present invention relates to electrode structures for a group arranged type unidirectional surface acoustic wave transducer, and more particularly it pertains to electrode structures for a group-arranged type unidirectional surface acoustic wave transducer which can be utilized as a filter with a desired band pass characteristic.

A surface acoustic wave device is a device using interdigital electrodes on a piezoelectric substrate as its input and output electrodes to thereby effect electromechanical signal conversion, and by virtue of its frequency characteristics and delay time characteristics, such a device has been employed as a signal processing device such as a filter, delay line and so forth.

In order to achieve a low insertion loss surface acoustic wave device, use has been made of unidirectional transducers to excite and receive a surface acoustic wave only in one direction. Such a unidirectional transducer may be classified into two different types, one of which constitutes a three-phase drive system wherein electrodes phase shifted 120° are provided as disclosed in U.S. Pat. Nos. 3,686,518 and 4,087,714. The other one of the aforementioned two types constitutes a two-phase drive system wherein electrodes phase shifted 90° are provided as disclosed in U.S. Pat. Nos. 3,800,248 and 3,866,154, and this is commonly referred to as a group-arranged type unidirectional surface acoustic wave transducer. In the three-phase drive system, it is required to provide complex electrode structures so that the wiring is complicated accordingly. In contrast thereto, in the two-phase drive system, relatively simple electrode structures are employed so that the wiring is also relatively simplified. Thus, group-arranged type unidirectional transducers have been predominantly employed.

The present invention is directed to group-arranged type unidirectional surface acoustic wave transucers such as mentioned above.

In a group-arranged type unidirectional surface acoustic wave transducer, a grounded electrode and two electrodes phase shifted 90° are combined to form two interdigital electrodes which constitute one interdigital electrode group; the two interdigital electrodes in one group are made equal to each other in terms of the number of electrode fingers; the two interdigital electrodes are also made equal to each other in terms of the opposing length of the electrode fingers; and the center-to-center distance between the two interdigital electrodes is made equal to an odd number of quarter wavelengths.

The conventional group-arranged type unidirectional surface acoustic wave device is so designed as to realize a desired frequency amplitude-attenuation characteristic by providing plural groups of two interdigital electrodes. In such an arrangement, however, a uniform impulse train is caused to occur with each of the plural groups; the impulse train envelope resulting from the combination of such uniform impulse trains also turns out to be uniform; and the use of electrodes phase shifted 90° makes it impossible to effect sign reversal of phase with respect to the impulse train envelope, thus resulting in a limited frequency amplitude-attenuation characteristic. Thus, the conventional device such as mentioned above finds only limited applications.

OBJECTS OF THE INVENTION

Accordingly, it is an object of the present invention to provide a novel and improved group-arranged type unidirectional surface acoustic wave transducer capable of achieving any desired frequency amplitude-attenuation characteristic, thereby eliminating the aforementioned drawbacks of the prior art.

Another object of the present invention is to provide a surface acoustic wave device with a lower insertion loss, which is suitable for use as a filter or the like.

BRIEF DESCRIPTION OF THE DRAWINGS

Other objects, features and advantages of the present invention will become apparent from the ensuing description taken in conjunction with the accompanying drawings.

FIGS. 1A and 2A are plan views showing electrode structures for group-arranged type unidirectional surface acoustic wave transducers.

FIGS. 1B and 2B illustrate impulse trains which occur with the electrode structures shown in FIGS. 1A and 2A, respectively.

FIG. 3 is a plan view showing an embodiment of the present invention.

DETAIL DESCRIPTION OF THE PREFERRED EMBODIMENTS

Figure 4:
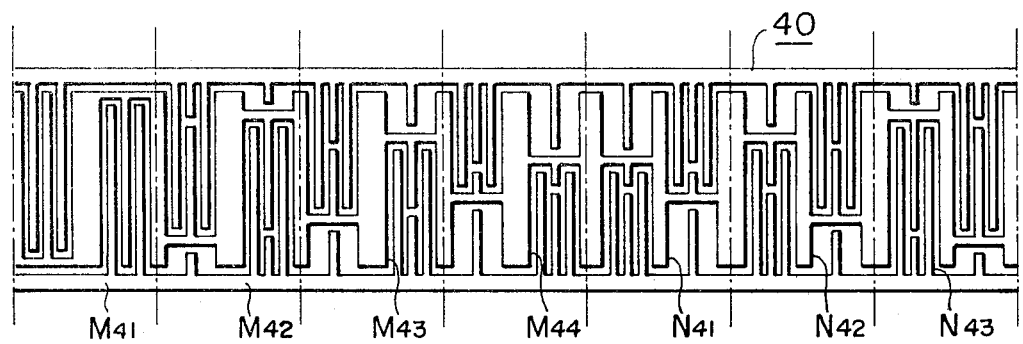
FIGS. 4 to 6 are plan views showing further embodiments of the present invention.

In order to give a better understanding of the present invention, description will first be made with reference to FIGS. 1A to 2B. As mentioned hereinbefore, there are two different types of group-arranged unidirectional surface acoustic wave transducers, one type of which, as shown in FIG. 1A, includes a first interdigital electrode group comprising N/2 pairs of interdigital electrode fingers defined by a first electrode 11 and ground electrode 13, and a second interdigital electrode group comprising N/2 pairs of interdigital electrode fingers defined by a second electrode 12 and the ground electrode 13, wherein the center-to-center distance between the two interdigital electrode groups is made equal to $(N/2+\frac{1}{4})\lambda$, where N is an integer and $\lambda$ is wavelength. With this arrangement, such an equivalent impulse train as shown in FIG. 1B occurs, and the surface acoustic wave as excited is made to propagate only in the direction as indicated by the arrow 14.

The other one of the aforementioned two different types is shown in FIG. 2A, which includes a first interdigital electrode group comprising N/2 pairs of interdigital electrode fingers defined by a first electrode 21 and ground electrode 23, and a second interdigital electrode group comprising N/2 pairs of interdigital electrode fingers defined by a second electrode 22 and the ground electrode 23, wherein the center-to-center distance between the two interdigital electrode groups is made equal to $(N/2+\frac{3}{4})\lambda$. With this arrangement, such an equivalent impulse train as shown in FIG. 2B occurs, and the surface acoustic wave as excited is made to propagate only in the direction as indicated by the arrow 24.

Hereinafter, the arrangement shown in FIG. 1A wherein the center-to-center distance between the two interdigital electrode groups is made equal to $(N/2+\frac{1}{4})\lambda$ will be referred to as N type, and the arrangement shown in FIG. 2A wherein such center-to-center distance is made equal to $(N/2+\frac{3}{4})\lambda$ will be referred to as M type, just for convenience of explanation.

As will be seen in FIG. 1B, the impulse train which occurs with the N type is such that impulses are void at the end portions of the two interdigital electrode groups, whereas the impulse train which occurs with the M type is such that an impulse is absent at the center between the two interdigital electrode groups. It will also be seen that the impulse trains occurring with the N type and M type are 180° out of phase with each other. Thus, with the aforementioned N type or M type alone, sign reversal of phase is impossible to achieve. In accordance with the present invention, however, it is possible to achieve sign conversion of phase as well as a desired impulse arrangement through the combination of the N type and M type.

The present invention will now be described with reference to the drawings. Referring to FIG. 3, there is shown, in a partial plan view, the group-arranged type unidirectional surface acoustic wave transducer according to an embodiment of the present invention, wherein the transducer indicated generally at 30 includes N type groups N31, N32 and M type groups M31, M32. With each of the groups N31, N32 an equivalent impulse train is developed as shown in FIG. 1B occurs, whereas with each of the groups M31, M32, an equivalent impulse train is developed as shown in FIG. 2B occurs. From this, it will be noted that the impulse trains become discontinuous at the boundary between the groups N32 and M31. The boundary referred to here is a position which is equidistant from the center of the ground electrode in each of the two groups. Thus, it will be appreciated that a suitable combination of the impulse trains which occur with the N type and M type makes it possible to produce a impulse train to achieve a desired frequency amplitude-attenuation characteristic and achieve corresponding signal transformation.

It has been found out that the N type group and M type group represent the same frequency characteristic with respect to backward waves, and that in the cases where the interdigital electrode of each group includes more than two pairs of electrode fingers, these two groups represent substantially the same characteristic with respect to forward waves, too. Even though the interdigital electrode of each of the N type and M type groups includes only one pair of electrode fingers, identical frequency characteristics occur in the neighborhood of the center frequency.

Referring to FIG. 4, there is shown the group type unidirectional surface acoustic wave transducer according to another embodiment of the present invention, wherein the transducer indicated generally at 40 includes N type groups N41 to N43, and M type groups M41 to M44. In this embodiment, it is to be noted that the respective groups are made different from each other in terms of the opposing length of the electrode fingers thereof. More specifically, the opposing length of the electrode fingers in the group M42 is made shorter than that in the group M41; the opposing length of the electrode fingers in the group M43 is made shorter than that in the group M42; and so on, so that the amplitudes of the impulses occurring with the respective groups can be made successively smaller. Furthermore, with the arrangement of this embodiment, a similar frequency characteristic to that of an ordinary surface acoustic wave filter can be achieved by virtue of the fact that sign reversal of phase occurs between the group M44 and the group N41.

By making the respective groups different from each other in terms of the opposing length of the electrode fingers, a impulse train envelope produced by subjecting any desired frequency characteristic to Fourier transformation to achieve such a characteristic can easily be attained with any desired polarity. Although the opposing lengths of the electrode fingers are made different from one group to another as mentioned above, it is to be noted that in each group, the opposing lengths of the electrode fingers must be made equal to each other.

Figure 5:
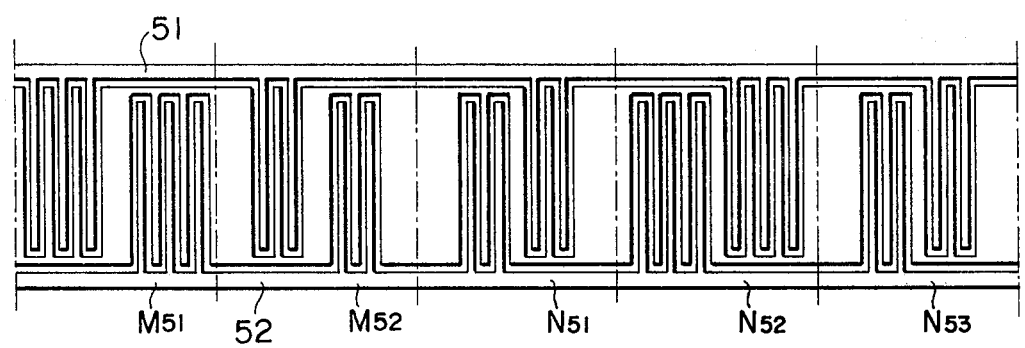

FIG. 5 shows a third embodiment wherein the respective groups are made different from each other in terms of the number of pairs of electrode fingers. The number of pairs referred to here indicates the number of electrode fingers connected to two electrodes 51 and 52. As will be seen from the drawing, the respective groups are made different from each other in terms of the number of electrode finger pairs in such a manner that each of the groups M51, N52 includes three pairs of electrode fingers and each of the groups M52, N51, N53 includes two pairs of electrode fingers, but it is to be noted that in all the groups, the interdigital electrodes thereof must include an equal number of pairs of electrode fingers. It will also be seen that larger ground electrodes are provided for groups which includes fewer numbers of pairs of electrode fingers.

Figure 6:
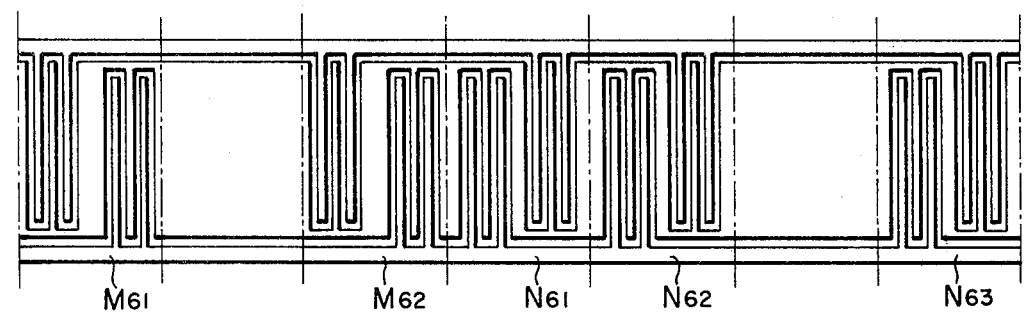

Referring to FIG. 6, there is a fourth embodiment wherein ground electrodes, instead of groups, are provided between the groups M61 and M62 and between the groups N63 and N62, thereby preventing impulses from occurring with the portions corresponding to the groups which have been replaced with the ground electrodes.

As will be appreciated from the above discussion, according to the present invention, an electrode finger arrangement which corresponds accurately to a desired impulse train envelope can be achieved, thereby making it possible to design a surface acoustic wave device which may be used as a filter or the like. Furthermore, the surface acoustic wave device embodying the present invention is a unidirectional one and thus represents only a low insertion loss.

While the present invention has been explained with respect to specific embodiments thereof, it is to be understood that the present invention is by no means limited thereto but covers all changes and modifications which will become possible within the scope of the appended claims.

What is claimed is:

1. A group-arranged type surface acoustic wave transducer including plural groups of two interdigital electrodes having an equal number of electrode finger pairs, connected 90° out of phase with each other, and disposed in such a manner that the center-to-center distance therebetween is equal to an odd number of quarter wavelengths, wherein:

the center-to-center distance between the interdigital electrodes in part of said plural groups is made to be equal to an integer number of wavelengths plus a quarter wavelength, and the center-to-center distance between the interdigital electrodes in the remaining groups is made to be equal to an integer number of wavelengths plus three quarter wavelengths.

2. A group-arranged type unidirectional surface acoustic wave transducer according to claim 1, wherein the two interdigital electrodes in each of said plural groups are made equal to each other in terms of the opposing length of the electrode fingers thereof, and the interdigital electrodes in at least one of said plural groups are made different from the interdigital electrodes in the remaining groups in terms of the opposing length of the electrode fingers.

3. A group-arranged type unidirectional surface acoustic wave transducer according to claim 1, wherein the two interdigital electrodes in each of said plural groups are made equal to each other in terms of the number of electrode finger pairs, and the interdigital electrodes in at least one of said plural groups are made different from the interdigital electrodes in the remaining groups in terms of the number of electrode finger pairs.

* * * * *